(12) United States Patent
Huang et al.

(10) Patent No.: US 10,890,604 B2
(45) Date of Patent: Jan. 12, 2021

(54) MONITORING DEVICE UNDER TEST WAVEFORM ON SIGNAL GENERATOR

(71) Applicant: Tektronix, Inc., Beaverton, OR (US)

(72) Inventors: Jianjie Huang, Shanghai (CN); Sicong Zhu, Shanghai (CN); Hu Tang, Shanghai (CN); Yufang Li, Shanghai (CN); Jin Qian, Shanghai (CN)

(73) Assignee: Tektronix, Inc., Beaverton, OR (US)

( * ) Notice: Subject to any disclaimer, the term of this patent is extended or adjusted under 35 U.S.C. 154(b) by 574 days.

(21) Appl. No.: 15/655,859

(22) Filed: Jul. 20, 2017

(65) Prior Publication Data
US 2019/0025344 A1    Jan. 24, 2019

(51) Int. Cl.
*G01R 13/02*    (2006.01)
*G01R 31/28*    (2006.01)
*G01R 19/25*    (2006.01)

(52) U.S. Cl.
CPC ..... *G01R 13/0218* (2013.01); *G01R 31/2841* (2013.01); *G01R 19/2506* (2013.01)

(58) Field of Classification Search
None
See application file for complete search history.

(56) References Cited

U.S. PATENT DOCUMENTS 6,249,128 B1 *  6/2001  Begg ............... G01R 35/005
                                                 324/601
6,268,735 B1 *  7/2001  Craig ............... G01R 23/20
                                                 324/601
6,397,160 B1 *  5/2002  Craig ............... G01R 31/2822
                                                 324/142
9,780,833 B2 * 10/2017  Fan ................. G01R 31/021
2003/0102907 A1 *  6/2003  Tasker ............. G01R 27/28
                                                 330/2
2014/0002109 A1 *  1/2014  Ugawa ............. G01R 27/28
                                                 324/649
2016/0291070 A1 * 10/2016  Bianchi ........... G01R 27/28

OTHER PUBLICATIONS

Kompa, Guenter; van Raay, Friedbert, Error-corrected large-signal waveform measurement system combining network analyzer and sampling oscilloscope capabilities, 1990, IEEE Transactions on Microwave Theory Techniques, 38(4), 358-365 (Year: 1990).*

* cited by examiner

*Primary Examiner* — Lina M Cordero
(74) *Attorney, Agent, or Firm* — Miller Nash Graham & Dunn; Andrew J. Harrington

(57) ABSTRACT

A test and measurement instrument having a signal generator circuit and a waveform monitor circuit for monitoring a waveform received at a device under test (DUT). The signal generator circuit generates a waveform based on an input from a user, while the waveform monitor circuit sends captured signals to a processor to determine a waveform received at the DUT. The waveform monitor captures a signal at a first test point and a second test point, via a switch, and the processor receives the captured signals and using linear equations determines both an incident waveform and a reflected waveform from the DUT.

19 Claims, 9 Drawing Sheets

MONITORING DEVICE UNDER TEST WAVEFORM ON SIGNAL GENERATOR

FIELD OF THE INVENTION

This disclosure is directed to systems and methods related to signal generators, and, more particularly, to systems and methods for determining and displaying on a signal generator a signal received at a device under test (DUT) from the signal generator.

BACKGROUND

Arbitrary Waveform and Function Generator (AFG) instruments are widely utilized for generating signals for electronic circuit design and testing. The AFG generates a signal that is received by a DUT. Typically, an AFG instrument has an output impedance of 50 ohms over its operating frequency range. When the DUT load impedance does not match the output impedance of the AFG instrument, the signal received at the DUT is not equivalent to the user setting on the AFG instrument. In some cases, this may result in damage to the DUT, as the DUT receives a signal that is different than the signal sent by the AFG instrument.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Disclosed herein is a test and measurement instrument having a signal generator circuit and a waveform monitor circuit for monitoring a waveform received at a device under test. The signal generator circuit generates a waveform based on an input from a user, while the waveform monitor circuit sends captured signals to a processor to determine a waveform received at the DUT. The waveform monitor captures a signal at a first test point and a second test point, via a switch, and the processor receives the captured signals and using linear equations determines both an incident waveform and a reflected waveform from the DUT.

Figure 1:
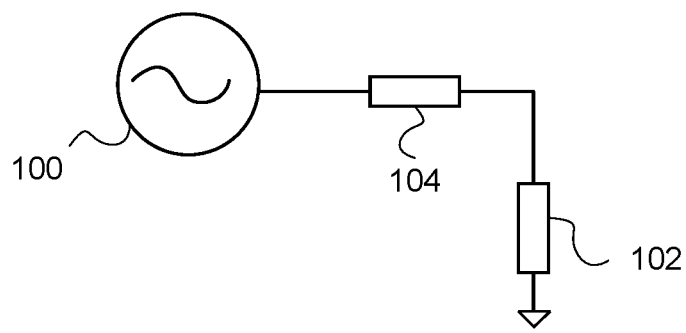
FIG. 1 is a block diagram of a signal generator connected to a device under test.

FIG. 1 is a block diagram of a signal generator 100 electrically coupled to a DUT 102. The DUT 102 has a 50 ohm impedance that matches the impedance 104 of 50 ohms of the signal generator 100. The real amplitude of a signal received at a DUT 102 is shown in equation (1):

$$\text{Real Amplitude} = \frac{DUT \text{ load}}{50 \text{ Ohm} + DUT \text{ load}} \times \text{Amplitude Setting} \times 2 \quad (1)$$

If the impedance of the DUT is not equal to 50 ohms, then the real amplitude received at the DUT is not equal to the user setting on the signal generator 100. If a DUT 102 load includes a large capacitor and inductor, the real amplitude received at the DUT 102 may be even more complex.

Figure 2:
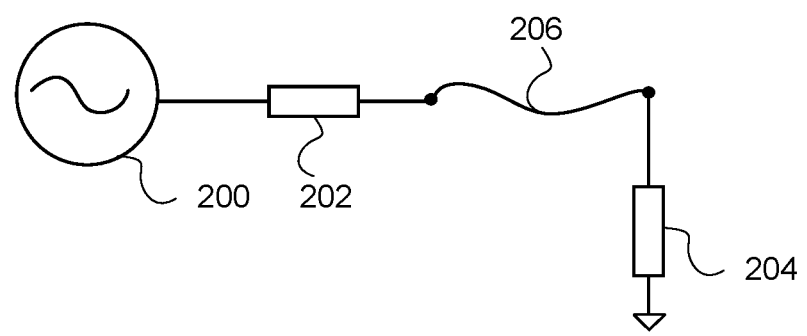
FIG. 2 is a block diagram of a signal generator connected to a device under test through a cable.

FIG. 2 illustrates a block diagram of a signal generator 200 having a 50 ohm impedance 202 attached to a DUT 204 via a cable 206, such as a Bayonet Neill-Concelman (BNC) cable. In FIG. 2, the cable 206 causes a reflection which results in the real amplitude received at the DUT 204 being different from the user settings on the signal generator 200.

To resolve this issue, a typical user may connect an oscilloscope to the DUT as well as the signal generator. Then, the user sees the real amplitude of the signal being received at the DUT, versus the signal set at the user settings. The user may then adjust the user setting on the signal generator based on the waveform the user observes on the oscilloscope. However, such a solution is expensive as it requires two pieces of equipment and a high impedance probe must be used.

Embodiments of the disclosure allow a user to determine the real amplitude of a signal being received at the DUT using only a signal generator without the need for an oscilloscope. That is, embodiments of the disclosure use a single test and measurement instrument to output a waveform and determine an actual, or real, waveform received at the DUT, and display such a waveform to a user.

Figure 3:
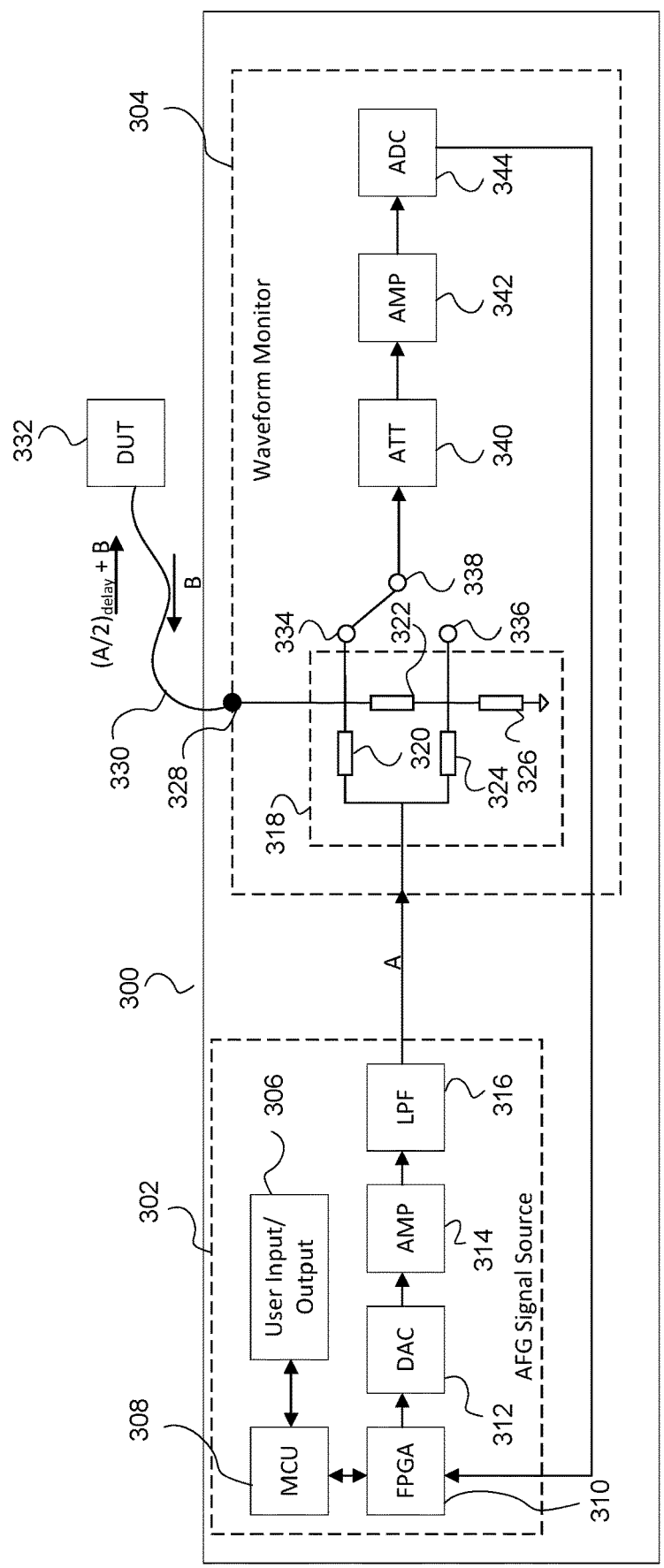
FIG. 3 is a block diagram of an exemplary test and measurement instrument according to some embodiments of the disclosure.

FIG. 3 illustrates a test and measurement system 300 according to embodiments of the disclosure. The test and measurement instrument 300 may be an arbitrary function generator or signal generator. The test and measurement instrument 300 includes an arbitrary function generation (AFG) signal source 302 portion and a waveform monitor 304 portion. Although the AFG signal source 302 and the waveform monitor 304 are depicted as separate, as would be understood by one having ordinary skill in the art, the components of the devices may be intermingled in one or more circuit boards and not actual separate devices.

The AFG signal source 302 includes a user input/output 306, such as a display screen with a dialog box. The AFG signal source 302 may also include a processor, such as a microcontroller unit 308 that communicates with the user input/output 306 as well as a field programmable gate array (FPGA) 310. In some embodiments, only a microcontroller unit (MCU) 308 or a FPGA 310 may be used, rather than a combination of both. In other embodiments, the processor may be implemented via one or more circuits, such as noise filters, interpolators, conversion circuits, etc., a digital signal processor (DSP), a general purpose processor, MCU 308, FPGA 310, and/or combinations thereof. Further, MCU 308 and/or the FPGA 310 may be located outside the AFG signal source 302 and may be located in the waveform monitor 304 or elsewhere within the test and measurement system.

Initially, a user inputs into the input/output 306 a desired signal to be generated. The MCU 308 processes this information and sends instructions to the FPGA 310. The FPGA 310 outputs a signal based on the user input and the instructions from the MCU 308. The signal from the FPGA 310 is converted to an analog signal through a digital-to-analog converter (DAC) 312. The converted signal passes through an amplifier 314 and a low pass filter 316 and is output as signal A to the waveform monitor 304. Other circuit variations may be used, as well, to output the generated signal A to the waveform monitor, as would be understood by one skilled in the art.

A directional coupler 318 of the waveform monitor 304 receives signal A and splits the signal into a first signal and a second signal. The first signal and the second signal both include the incident waveform which is theoretically half of signal A. However, as understood by one of ordinary skill in the art, various interferences and resistances within the test and measurement system may cause the first and second signal to not be exactly half of signal A. The directional coupler 318 includes four resistors 320-226 for splitting signal A into the first and second signals. In some embodiments, each resistor may be 50 ohms.

The directional coupler 318 outputs the first signal from an output 328 to a BNC cable 330 connected to a DUT 332. A reflected waveform B from the DUT 332 travels back toward the output 328 through the cable 330. The reflected waveform B affects the first signal, such that the signal received at the device under test is determined by the following equation (2):

$$DUT\ \text{waveform} = \left(\frac{A}{2}\right)_{delay} + B \tag{2}$$

The delay is the delay from the signal traveling through the BNC cable 330. This delay may be stored in a memory of the test and measurement instrument 300 or the delay may be entered in the test and measurement system via the user input/output 306. For example, the test and measurement system may display a dialog box requesting the BNC cable 330 delay amount. A user may then enter this delay. The user may determine the delay of the BNC cable 330 by using an oscilloscope to measure the delay of the cable. In some embodiments, the test and measurement instrument 300 may automatically determine the delay of the BNC cable 330.

The waveform monitor circuit 304 includes two test points 334 and 336 to allow the processor to determine the DUT waveform. That is, using linear equations, the waveform monitor circuit 304 calculates the incident waveform which should be approximately half of signal A and the reflected waveform B. A switch 338 selects between the two test points 334 and 336. First test point 334 includes first signal which is the incident waveform plus the reflected waveform B. Second test point 336 includes the second signal which is the incident waveform plus half the reflected waveform B. When either first test point 334 or second test point 336 is selected by switch 338, the signal at the test point is processed through an attenuator 340, an amplifier 342, and is converted to a digital signal via an analog-to-digital converter (ADC) 344. The digital signal is then sent to the FPGA 310 to be processed by the FPGA 310 and the MCU 308 to determine the DUT waveform. The signal may be saved in a memory (not shown) prior to being processed.

The method for determining the DUT waveform is based on high speed signal reflection. A DUT load reflection coefficient $\Gamma_L$ is shown by equation (3):

$$\Gamma_L = \frac{Z_L - Z_c}{Z_L + Z_c} \tag{3}$$

$Z_L$ is the impedance of the DUT load and $Z_C$ is the BNC cable impedance of typically 50 ohms.

The signal source side reflection coefficient $\Gamma_S$ is shown by equation (4):

$$\Gamma_S = \frac{Z_S - Z_c}{Z_S + Z_c} \tag{4}$$

$Z_S$ is the impedance of the AFG signal source 302 which is typically 50 ohms. Since the AFG signal source 302 and the BNC cable have the same impedance, the signal source side reflection coefficient $\Gamma_S$ is 0 and there is not an AFG signal source 302 reflection.

The DUT waveform is determined by equation (5):

$$DUT\ \text{waveform} = V_{incident} + V_{incident} * \Gamma_L = \frac{A}{2} + \frac{A}{2} * \Gamma_L = \left(\frac{A}{2}\right)_{delay} + B \tag{5}$$

For an arbitrary waveform, $$\frac{A}{2} * \Gamma_L$$

is difficult to calculate by a processor, so the above method is best suited for a time domain analog waveform, using ADC 344 to convert the waveform, as discussed above.

The directional coupler 318 works as a balance bridge and splits the incident waveform and the reflected waveform. If a DUT impedance is equal to 50 ohms, then there is no reflected signal B. If the DUT impedance is not equal to 50 ohms, then the test and measurement instrument 300 is able to determine the DUT waveform based on measuring the values at the first test point 334 and the second test point 336.

Figure 4:
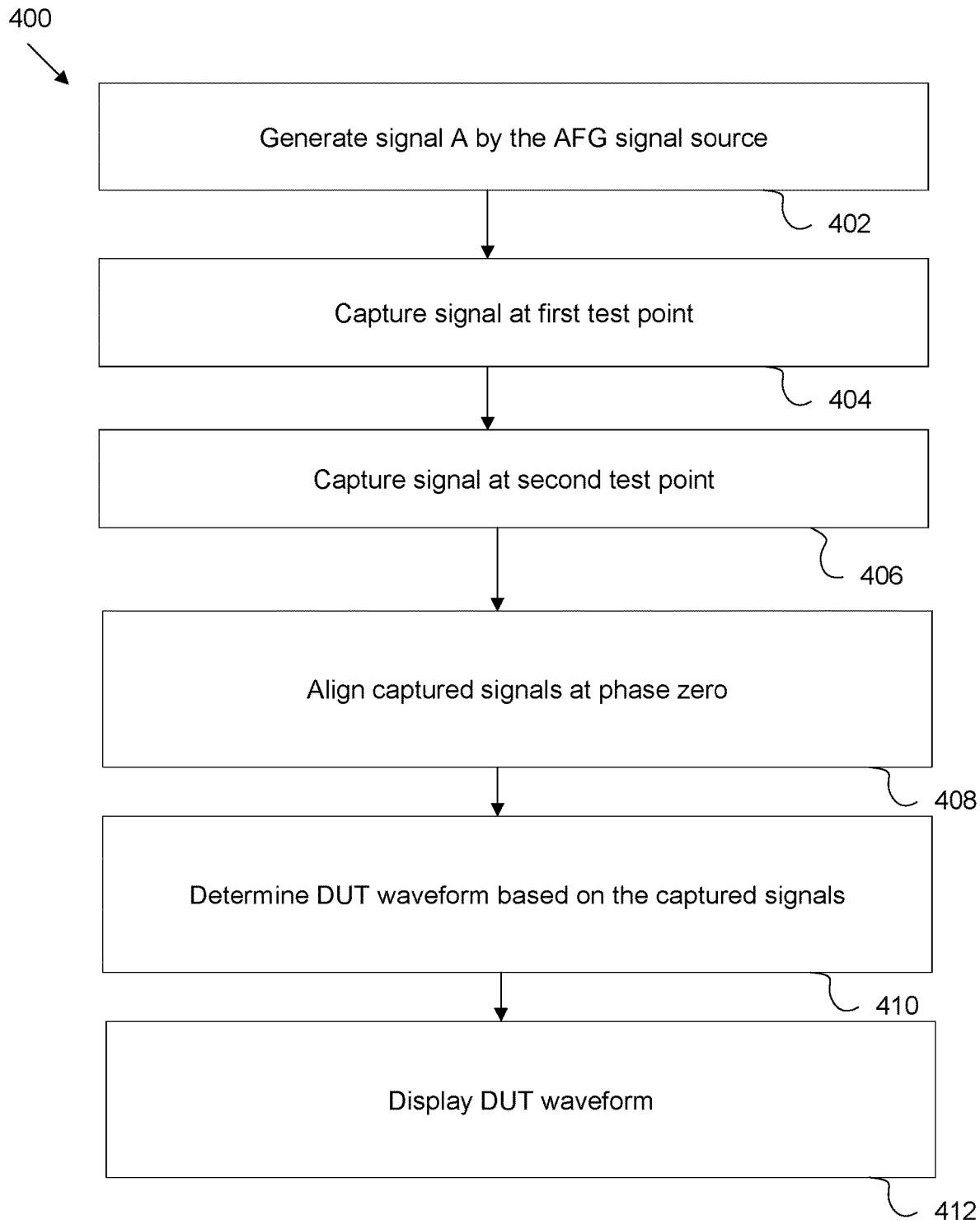
FIG. 4 is a flow chart of an example method to determine a DUT waveform using the test and measurement instrument of FIG. 3.

FIG. 4 illustrates a method 400 for determining the incident waveform received by the DUT 332 by the MCU 308 and FPGA 310.

Initially, a signal A is generated 402 by the AFG signal source 302 based on a user input. The switch 338 is set to capture 404 the signal at the first test point 334. Then, the switch 338 is set to capture 406 the signal at the second test point 336. The switch 338 may capture the second signal at the second test point 336 prior to capturing the first signal at the first test point 334. Both captured signals are converted to digital signals and sent 408 to the FPGA 310. The FPGA 310 time-aligns both the signals to the AFG direct digital synthesizer (DDS) at phase zero. The FPGA sends the signals from both test points 334 and 336 to the MCU 308 to determine 410 the incident waveform at the DUT 332. Using the linear equations, the MCU 308 calculates the incident waveform and the reflected waveform.

Using the calculated incident waveform (A/2) and reflected waveform (B), the waveform present at the DUT 332 can be calculated using equation (2) above.

Once the DUT waveform is calculated, the DUT waveform is displayed 412 on the user input/output 306 so a user may make adjustments at the user input/output to receive the signal desired at the DUT 332.

Figure 5:
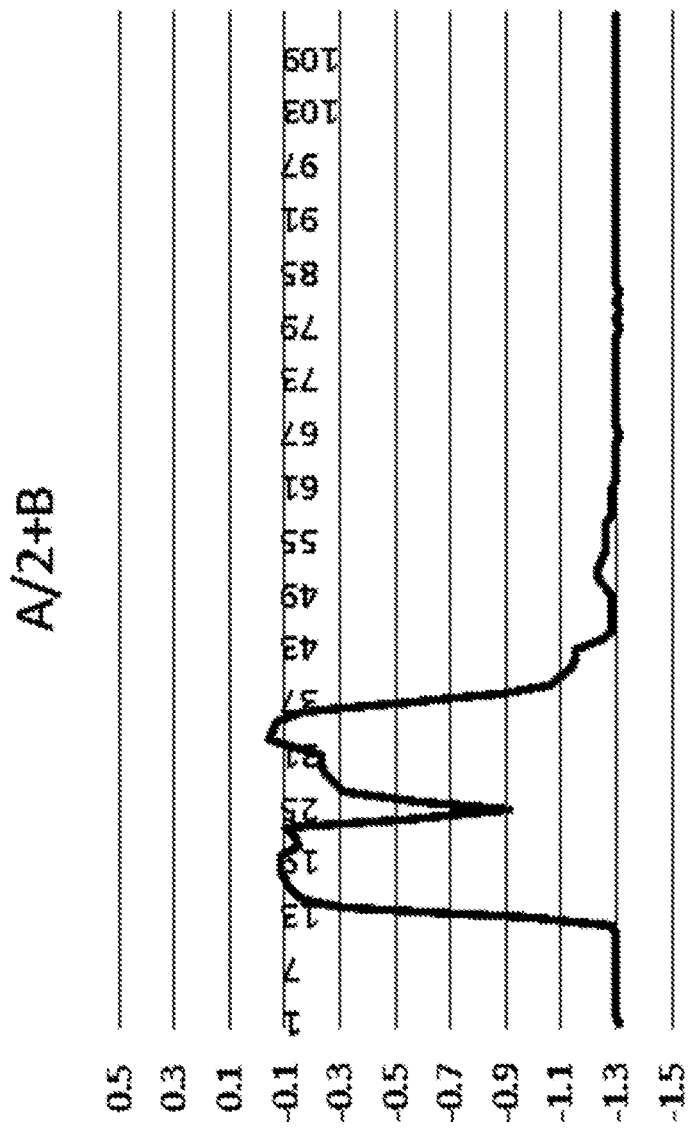
FIG. 5 is an example of a captured waveform at a first test point.
Figure 6:
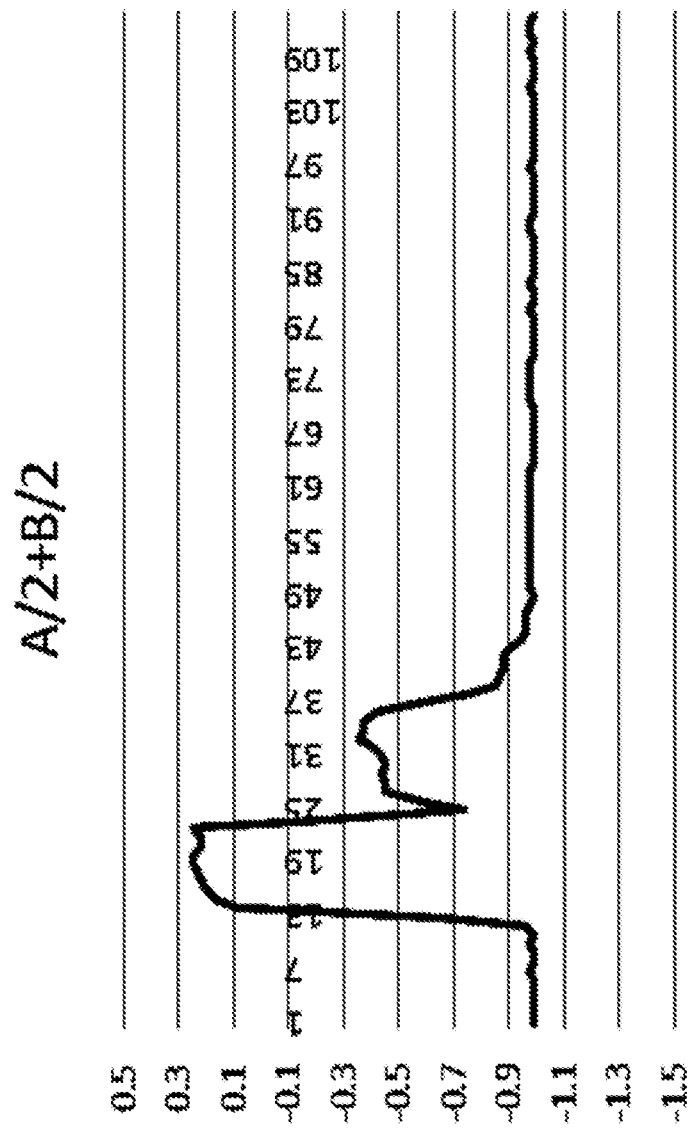
FIG. 6 is an example of a captured waveform at a second test point.
Figure 7:
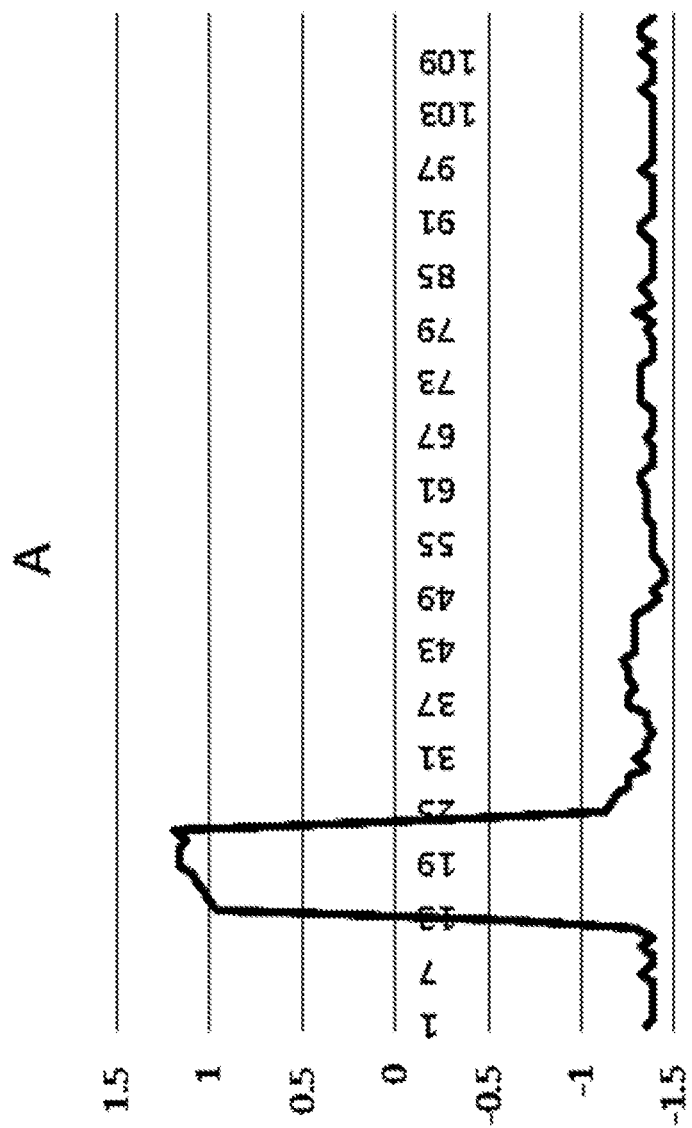
FIG. 7 is an example of a determined waveform A based on the waveforms of FIGS. 5 and 6.
Figure 8:
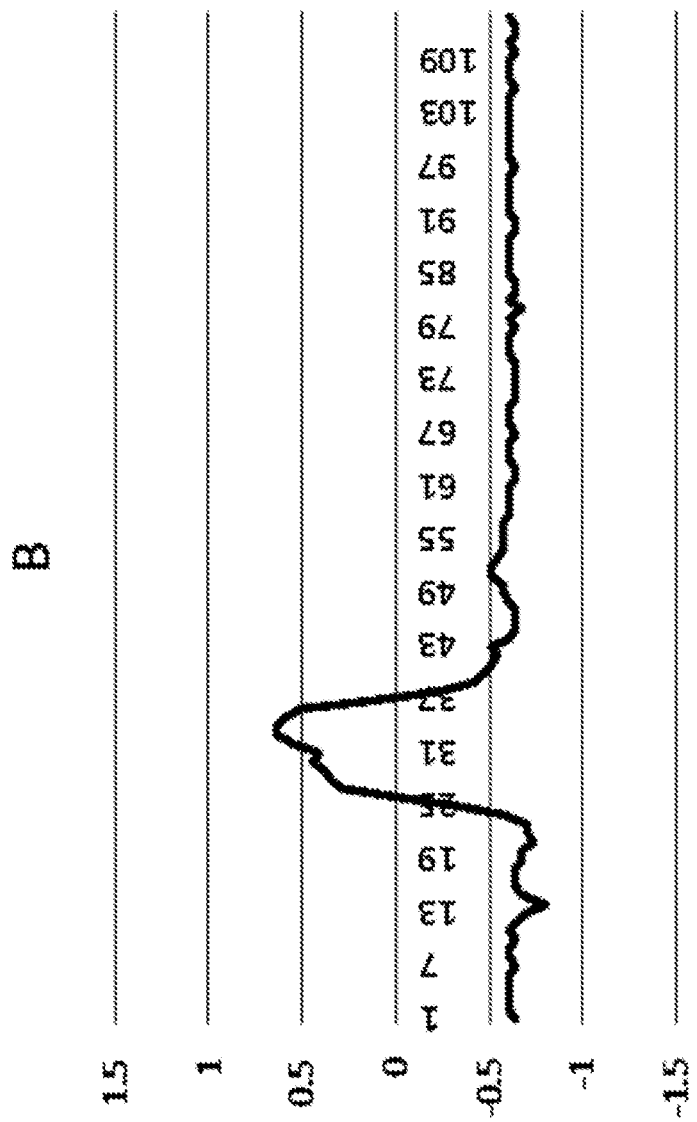
FIG. 8 is an example of a determined waveform B based on the waveforms of FIGS. 5 and 6.
Figure 9:
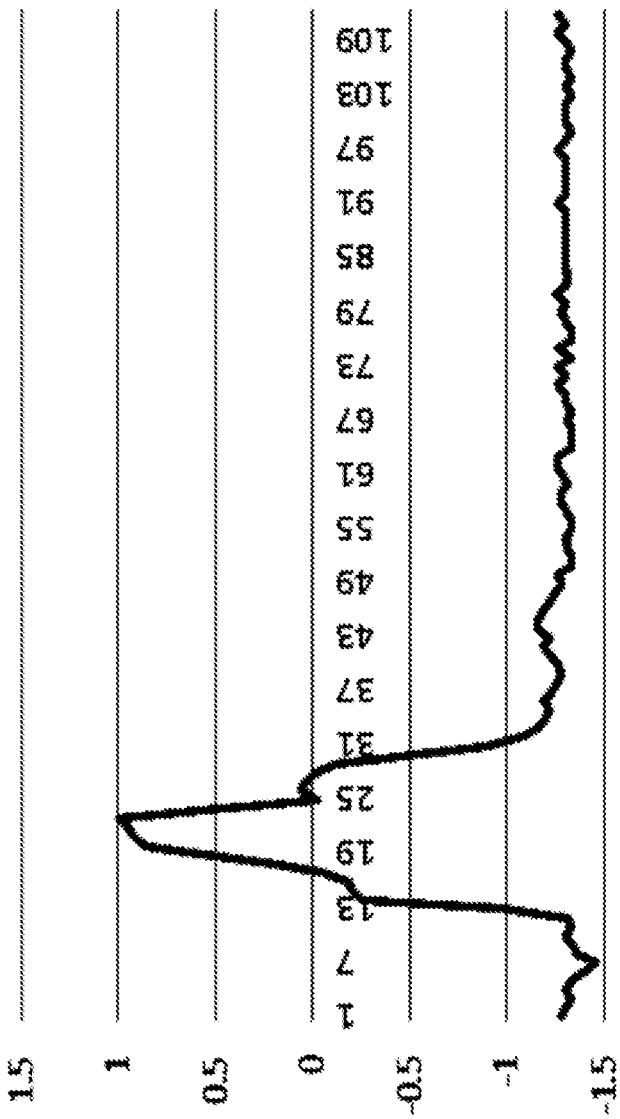
FIG. 9 is an example of a determined DUT waveform based on the waveforms of FIGS. 7 and 8.

FIGS. 5-9 illustrate example captured waveforms and the determined waveforms from the captured waveforms. FIG. 5 illustrates a captured waveform at the first test point 334, consisting of signals A/2+B. FIG. 6 illustrates a captured waveform at the second test point 336, consisting of signals A/2+B/2. Based on these captured waveforms, the MCU 308 determines both incident waveform A, as shown in FIG. 7 and reflected waveform B, as shown in FIG. 8. Using these determined waveforms, the MCU 308 is able to determine the DUT waveform, as shown in FIG. 9. This waveform may then be displayed on the user input/output 306 so that a user can see the actual waveform received at the DUT 332. Depending on the waveform the user wants to use to test the DUT 332, the user is able to easily make adjustments to the input so that the desired waveform is received at the DUT.

In some embodiments, the FPGA 310 may control equivalent sampling and capture signals at test points 334 and 336 a variety of times. The FPGA 310 then sends the captured signals after the equivalent sampling has finished.

Figure 10:
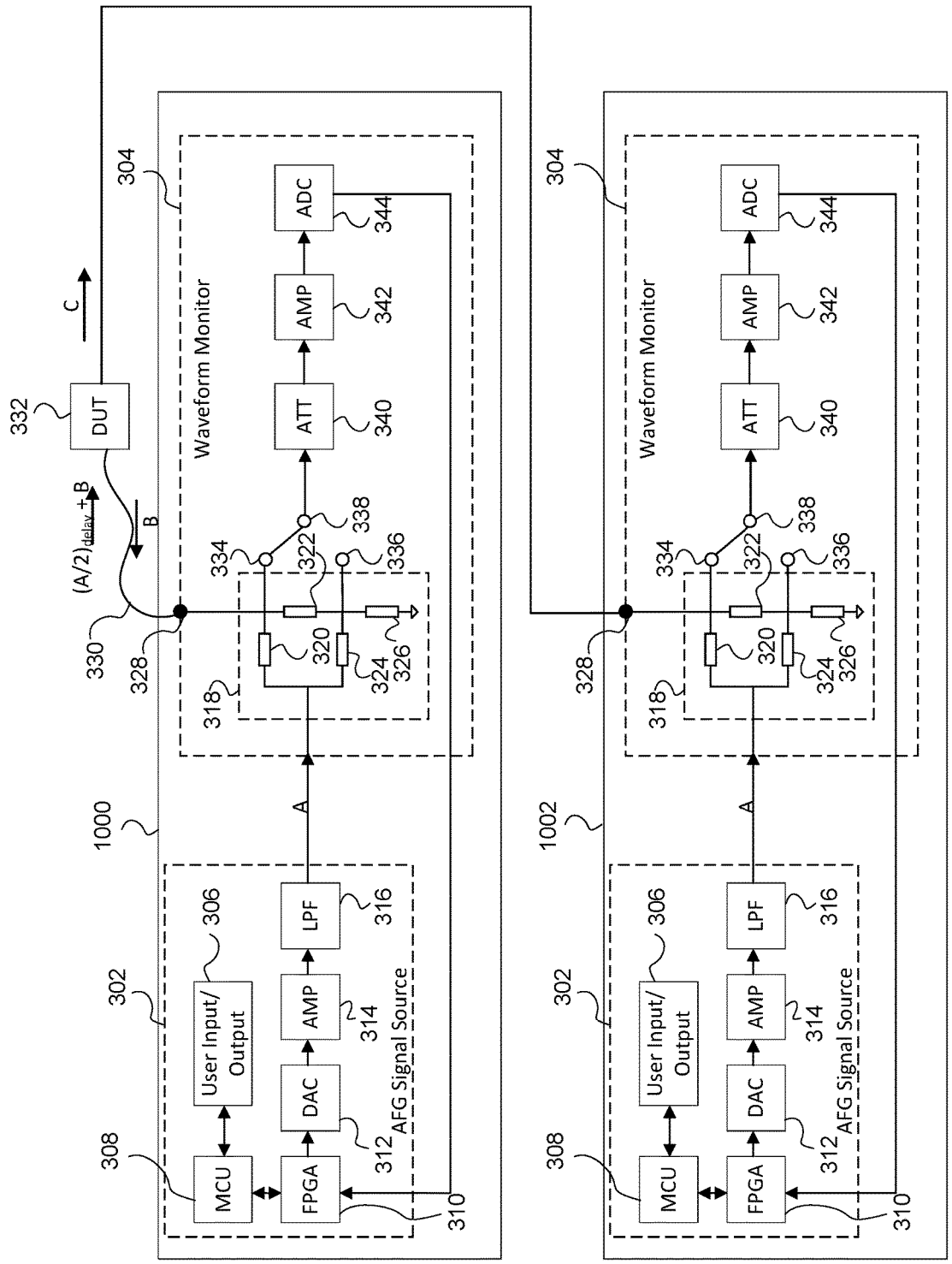
FIG. 10 is a block diagram of an exemplary test and measure instrument according to other embodiments of the disclosure.

Still yet, in other embodiments, the instrument discussed above may be used to test a frequency response line during filter or amplifier design, as shown in FIG. 10. The test and measurement device 300 may include multiple channels 1000 and 1002 within the test and measure device, each channel including the AFG signal source 302 and the waveform monitor 304 discussed in detail above. Accordingly, similar features in each channel 1000 and 1002 are identified with the same reference number. Although two channels are depicted in FIG. 10, more than two channels may be included within the test and measurement device 300. Further, some channels may include features and components different from the channels 1000 and 1002.

To test a frequency response of DUT 332, the test and measurement instrument 300 may generate a sweep sine wave to a DUT load on a first channel 1000. In this configuration, the switch 338 of channel 1000 is set to test point 334. A waveform monitor circuit 304 of a second channel 1002 connects to the DUT 332 through the BNC output 328 of the second channel 1002. The output from the DUT is a waveform C.

The switch 338 of channel 1002 is set to test point 334 and does not generate any signal from the AFG signal source 302. In the scenario, channel 1000 acts as a normal AFG and generates a sweep sine wave, and channel 1002 receives the DUT 332 response signal C as an oscilloscope and the test point 334 of channel 1002 is the signal of DUT response C. Channel 1002 sends the DUT response signal C to FPGA 310 of channel 1002 and then to MCU 308 of channel 1002 so that the DUT frequency response can be acquired.

Examples of the invention may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a test and measurement instrument comprising a signal generator to generate a waveform based on an input from a user, a processor, and a waveform monitor circuit. The waveform monitor circuit includes a directional coupler to receive the waveform and split the waveform into a first signal and a second signal, an output to connect to a device under test through a cable and output the first signal to the device under test, a first test point having a first test point signal that includes the first signal, a second test point having a second test point signal that includes the second signal, and a switch to connect the first test point and the second test point to the processor of the signal generator, the processor configured to determine a received waveform at the device under test based on the first test point signal and the second test point signal.

Example 2 is the test and measurement instrument of example 1, wherein the processor is further configured to determine the received waveform at the device under test based on a delay of the cable.

Example 3 is the test and measurement instrument of example 2, further comprising a user input to receive the delay of the cable.

Example 4 is the test and measurement instrument of any one of examples 1-3, wherein the first signal is half the waveform and the first test point includes the first signal plus a signal reflected through the cable from the device under test, and wherein the second signal is half the waveform and the second test point includes the second signal plus half the signal reflected through the cable from the device under test.

Example 5 is the test and measurement instrument of any one of examples 1-4, wherein the waveform monitor circuit further includes an attenuator electrically connected to the switch, an amplifier electrically connected to the attenuator, and an analog-to-digital convertor electrically connected to the amplifier and the processor.

Example 6 is the test and measurement instrument of any one of examples 1-5, further comprising a display to display the received waveform determined by the processor.

Example 7 is the test and measurement instrument of any one of examples 1-6, wherein the processor includes a field programmable gate array electrically connected to a microprocessor.

Example 8 is a method for determining a received waveform at a device under test, the method comprising generating a waveform based on a user input; splitting via a directional coupler the generated waveform into a first signal and a second signal; outputting the first signal to a device under test through a connected cable; determining a value of a first test point, the first test point including the first signal; determining a value of a second test point, the second test point including the second signal; and based on the value of the first signal at the first test point and the value of the second signal at the second test point, determining the received waveform at the device under test.

Example 9 is the method of example 8, wherein determining the received waveform at the device under test includes determining the received waveform based on a delay of the cable.

Example 10 is the method of example 9, further comprising receiving the delay of the cable through the user input.

Example 11 is the method of any one of examples 8-10, wherein the first signal is half the waveform and the first test point includes the first signal plus a signal reflected through the cable from the device under test, and wherein the second signal is half the waveform and the second test point includes the second signal plus half the signal reflected through the cable from the device under test.

Example 12 is the method of any one of examples 8-11, further comprising displaying on a display the received waveform at the device under test.

Example 13 is the method of any one of examples 8-12, further comprising switching between the first test point and the second test point via a switch.

Example 14 is a computer readable storage medium having instructions stored thereon that, when executed by a processor of a test and measurement instrument, cause the test and measurement instrument to generate a waveform based on a user input; output a first signal to a device under test through a connected cable based on the generated waveform; determine a value of a first test point, the first test point including the first signal; determine a value of a second test point, the second test point including a second signal based on the generated waveform; and determine a received waveform at the device under test through the connected cable from the output of the first signal based on the value of the first test point and the value of the second test point.

Example 15 is the computer readable storage medium of example 14, wherein the received waveform at the device under test is determined based on a delay of the cable.

Example 16 is the computer readable storage medium of example 15, wherein the instructions stored thereon further cause the test and measurement instrument to receive the delay of the cable through the user input.

Example 17 is the computer readable storage medium of any one of examples 14-16, wherein the first signal is half the waveform and the first test point includes the first signal plus a signal reflected through the cable from the device under test, and wherein the second signal is half the waveform and the second test point includes the second signal plus half the signal reflected through the cable from the device under test.

Example 18 is the computer readable storage medium of any one of examples 14-17, wherein the instructions stored thereon further cause the test and measurement instrument to display the received waveform at the device under test.

Example 19 is the computer readable storage medium of any one of examples 14-18, wherein the instructions stored thereon further cause the test and measurement instrument to switch between the first test point and the second test point via a switch.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument comprising:
a signal generator to generate a waveform based on an input from a user;
a processor; and
a waveform monitor circuit, including:
a directional coupler to receive the waveform and split the waveform into a first signal and a second signal,
an output to receive the first signal, connect to a device under test through a cable and output the first signal to the device under test,
a first test point to connect to the output and having a first test point signal that includes the first signal, a second test point to connect to the output and having a second test point signal that includes the second signal, and
a switch to connect the first test point and the second test point to the processor, the processor configured to determine, without measurement at the device under test, a received waveform at the device under test based on the first test point signal and the second test point signal.

2. The test and measurement instrument of claim 1, wherein the processor is further configured to determine the received waveform at the device under test based on a delay of the cable.

3. The test and measurement instrument of claim 2, further comprising a user input to receive the delay of the cable.

4. The test and measurement instrument of claim 1, wherein the first signal is half the waveform and the first test point includes the first signal plus a signal reflected through the cable from the device under test, and wherein the second signal is half the waveform and the second test point includes the second signal plus half the signal reflected through the cable from the device under test.

5. The test and measurement instrument of claim 1, wherein the waveform monitor circuit further includes an attenuator electrically connected to the switch, an amplifier electrically connected to the attenuator, and an analog-to-digital convertor electrically connected to the amplifier and the processor.

6. The test and measurement instrument of claim 1, further comprising a display to display the received waveform determined by the processor.

7. The test and measurement instrument of claim 1, wherein the processor includes a field programmable gate array electrically connected to a microprocessor.

8. A method for determining a received waveform at a device under test, the method comprising:
generating a waveform based on a user input;
splitting, via a directional coupler, the generated waveform into a first signal and a second signal; outputting, via an output, the first signal to the device under test through a connected cable;
determining a value of a first test point connected to the output, the first test point including the first signal;
determining a value of a second test point connected to the output, the second test point including the second signal; and
based on the value of the first signal at the first test point and the value of the second signal at the second test point, determining the received waveform at the device under test, without measurement at the device under test.

9. The method of claim 8, wherein determining the received waveform at the device under test includes determining the received waveform based on a delay of the connected cable.

10. The method of claim 9, further comprising receiving the delay of the connected cable through the user input.

11. The method of claim 8, wherein the first signal is half the generated waveform and the first test point includes the first signal plus a signal reflected through the connected cable from the device under test, and wherein the second signal is half the generated waveform and the second test point includes the second signal plus half the signal reflected through the connected cable from the device under test.

12. The method of claim 8, further comprising displaying on a display the received waveform at the device under test.

13. The method of claim 8, further comprising switching between the first test point and the second test point via a switch.

14. A non-transitory computer readable storage medium having instructions stored thereon that, when executed by a processor of a test and measurement instrument, cause the test and measurement instrument to:
generate a waveform based on a user input;
output a first signal to a device under test through an output connected to a cable based on the generated waveform;
determine a value of a first test point connected to the output, the first test point including the first signal;
determine a value of a second test point connected to the output, the second test point including a second signal based on the generated waveform; and
determine a received waveform at the device under test through the connected cable based on the value of the first test point and the value of the second test point, without measurement at the device under test.

15. The non-transitory computer readable storage medium of claim 14, wherein the received waveform at the device under test is determined based on a delay of the connected cable.

16. The non-transitory computer readable storage medium of claim 15, wherein the instructions stored thereon further cause the test and measurement instrument to receive the delay of the connected cable through the user input.

17. The non-transitory computer readable storage medium of claim 14, wherein the first signal is half the generated waveform and the first test point includes the first signal plus a signal reflected through the connected cable from the device under test, and wherein the second signal is half the generated waveform and the second test point includes the second signal plus half the signal reflected through the connected cable from the device under test.

18. The non-transitory computer readable storage medium of claim 14, wherein the instructions stored thereon further cause the test and measurement instrument to display the received waveform at the device under test.

19. The non-transitory computer readable storage medium of claim 14, wherein the instructions stored thereon further cause the test and measurement instrument to switch between the first test point and the second test point via a switch.

* * * * *